(12) United States Patent
Kawanabe et al.

(10) Patent No.: US 7,719,364 B2
(45) Date of Patent: May 18, 2010

(54) HIGH FREQUENCY POWER AMPLIFIER

(75) Inventors: Fumitake Kawanabe, Kodaira (JP); Yoichi Okubo, Kodaira (JP); Yasuo Sera, Kodaira (JP); Manabu Nakamura, Kodaira (JP); Toshio Nojima, Sapporo (JP); Taizo Ito, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/379,073

(22) Filed: Feb. 12, 2009

(65) Prior Publication Data

US 2009/0201089 A1 Aug. 13, 2009

(30) Foreign Application Priority Data

Feb. 12, 2008 (JP) .............................. 2008-030065

(51) Int. Cl.
*H03F 3/04* (2006.01)

(52) U.S. Cl. ...................................... 330/302; 330/149

(58) Field of Classification Search ................. 330/302, 330/149
See application file for complete search history.

(56) References Cited

U.S. PATENT DOCUMENTS 6,320,462 B1 * 11/2001 Alley ...................... 330/124 R
7,427,895 B1 * 9/2008 Okubo et al. ........... 330/124 R

* cited by examiner

*Primary Examiner*—Henry K Choe
(74) *Attorney, Agent, or Firm*—Bacon & Thomas, PLLC

(57) ABSTRACT

A high frequency power amplifier includes an amplifying device for amplifying an input high frequency signal, a harmonic reflection circuit for reflecting a harmonic outputted from the amplifying device, and a harmonic generating circuit provided at an input terminal of the amplifying device, the harmonic generating circuit including a divider for dividing an input signal of a fundamental wave into two parts, a harmonic generator for generating a second harmonic from one part of the fundamental wave signal, and a combiner for combining the second harmonic generated from the harmonic generator with the other part of the fundamental wave signal to offer a combined signal to the amplifying device, wherein the harmonic reflection circuit reflects the second harmonic.

7 Claims, 8 Drawing Sheets

HIGH FREQUENCY POWER AMPLIFIER

FIELD OF THE INVENTION

The present invention relates to a high frequency power amplifier for amplifying a high frequency signal; and more particularly, to a high frequency power amplifier capable of improving power conversion efficiency.

BACKGROUND OF THE INVENTION

Description of the Prior Art

A power amplifier for transmission amplifies power of a high frequency signal to a desired transmission power level. In most radio devices, the power amplifier is a part consuming a largest power in the device.

The power consumed by the power amplifier is not only converted to high frequency output power, but is also dissipated as heat (internal loss).

Accordingly, it is possible to reduce power consumption and improve reliability by reducing heat dissipation. For this, it is required to increase power conversion efficiency of the power amplifier and reduce the internal loss.

In order to meet this requirement, there are amplifiers capable of performing various high efficiency operations, for example, a class F amplifier.

Conventional F-Class Amplifier

FIGS. 7A and 7B

A conventional class F amplifier will be described with reference to FIGS. 7A and 7B. FIGS. 7A and 7B are block diagrams showing schematic configurations of the conventional class F amplifier.

As shown in FIG. 7A, the conventional class F amplifier includes an input terminal 11, an output terminal 12, an input matching circuit 13, a field effect transistor (FET) 14, an output matching circuit 15, and a harmonic reflection circuit (HRC) 16.

The input matching circuit 13 is an impedance conversion circuit for matching an input impedance of the FET 14 to a characteristic impedance Z0 for an input signal.

Further, the output matching circuit 15 is an impedance conversion circuit for matching an output impedance of the FET 14 to a characteristic impedance Z0 at a fundamental frequency f0.

The FET 14 is an active device for amplifying an input signal to output the amplified signal. The input signal is applied to a gate terminal, and a source terminal is grounded. Further, a bipolar transistor or an electron tube may be used as an active device instead of the FET.

The harmonic reflection circuit 16 is connected to a drain terminal of the FET 14. The harmonic reflection circuit 16 has impedance characteristics that the circuit is open for fundamental and odd harmonic frequencies and shorted for even harmonic frequencies. Accordingly, the load impedance characteristics at an output terminal (drain terminal) of the FET 14 are "matching" at the fundamental frequency, "short" at even harmonic frequencies and "open" at odd harmonic frequencies.

Further, the input signal is inputted to the gate terminal of the FET 14 from the input terminal 11 via the input matching circuit 13. The signal amplified by the FET 14 is outputted to the output terminal 12 through the drain terminal of the FET 14 and the output matching circuit 15. Further, the odd harmonics generated in the FET 14 are reflected by the harmonic reflection circuit 16 and, then, inputted to the FET 14 and also amplified.

Next, theoretical waveforms of voltage and current in the class F amplifier are described with reference to FIG. 8. FIG. 8 shows theoretical waveforms of voltage and current in the class F amplifier.

As shown in FIG. 8, when the FET 14 of the amplifier shown in FIG. 7A is operated under class B bias conditions and a sine wave of a fundamental frequency is inputted thereto, theoretically, a voltage-time waveform between the drain terminal and the source terminal is a square waveform having only the fundamental wave and odd harmonic components.

Further, a current-time waveform between the drain terminal and the source terminal is a half waveform having only the fundamental wave and even harmonic components.

In the operation of the FET 14, a drain voltage is zero when a drain current flows, whereas a drain current is zero when a drain voltage is applied. Accordingly, power consumed between the drain terminal and the source terminal can be zero all the time.

That is, when voltage and current time waveforms do not overlap each other as shown in FIG. 8, there is no power consumed by the FET 14 and it is possible to prevent internal loss. This is a theory of the class F amplifier.

Further, there is an amplifier operated opposite to the above-mentioned class F amplifier. In this amplifier, the impedance characteristics are "matching" at a fundamental frequency, "open" at even harmonic frequencies and "short" at odd harmonic frequencies. Accordingly, it is possible to obtain waveforms opposite to the waveforms of FIG. 8. A harmonic reflection circuit of this amplifier reflects even harmonics. Also in this case, a drain voltage is zero when a drain current flows, whereas a drain current is zero when a drain voltage is applied. Accordingly, in the same way, power consumed between the drain terminal and the source terminal may be zero all the time.

However, in a case where a high frequency class F amplifier has a harmonic reflection circuit outside a package thereof, at not only a fundamental frequency but also a second harmonic frequency, the circuit needs to be designed considering reactance caused by an FET package, wire bonding or the like or a self-impedance of the FET chip.

There is another conventional class F amplifier, which employs a second harmonic frequency and improves efficiency by avoiding influence of various types of floating reactances caused by the FET or the FET package.

The class F amplifier using a second harmonic frequency to improve efficiency is explained with reference to FIG. 7B.

As shown in FIG. 7B, the another conventional class F amplifier includes an input terminal 11, an output terminal 12, an input matching circuit 13, an FET 14, and an output matching circuit 15 and a harmonic reflection circuit (HRC) 16.

The harmonic reflection circuit 16 is a termination circuit connected in parallel between the output matching circuit 15 and the output terminal 12. The harmonic reflection circuit 16 has a high input impedance at an input signal frequency and a low input impedance at a second harmonic frequency.

The input matching circuit 13 has impedance characteristics that conjugate matching is performed on an input impedance of the FET 14 at both an input signal frequency and a second harmonic frequency thereof.

The output matching circuit 15 has impedance characteristics that conjugate matching is performed on an output impedance of the FET 14 at both the input signal frequency and the second harmonic frequency thereof. Those facts are different from the amplifier shown in FIG. 7A.

Further, the harmonic reflection circuit 16 provided at the back of the output matching circuit 15 reflects a wave signal of a double frequency (second harmonic) generated at the drain terminal of the FET 14 to the FET 14. Accordingly, it is possible to obtain a voltage waveform close to a square waveform and easily perform a switching operation required for a high efficiency operation.

Further, there is a Doherty amplifier as one of conventional amplifiers for improving efficiency.

A configuration of the conventional Doherty amplifier is explained with reference to FIG. 9. FIG. 9 is a block diagram showing a configuration of the conventional Doherty amplifier.

As shown in FIG. 9, the conventional Doherty amplifier includes an input terminal 1, an output terminal 2, a divider (DV) 4, a carrier amplifying circuit 6, a peak amplifying circuit 7, a transmission line (TL) 8, a combination node 9 and a transmission line (TL) 10.

Further, the carrier amplifying circuit 6 includes an input matching circuit 61, an FET 62, and an output matching circuit 63. The peak amplifying circuit 7 includes an input matching circuit 71, an FET 72, and an output matching circuit 73.

A signal inputted from the input terminal 1 is divided into two parts by the divider 4. Then, one part of the signal is inputted to the carrier amplifying circuit 6 in which it is amplified by the FET 62 and passes through the output matching circuit 63, and is impedance-converted in the transmission line 8.

The other part of the signal, divided by the divider 4, is phase-adjusted corresponding to the carrier amplifying circuit 6 by a phase shifter 5. Then, the other part of the signal is inputted to the peak amplifying circuit 7 in which it is amplified by the FET 72 and is impedance-converted by the output matching circuit 73 to be outputted.

The output from the transmission line 8 and the output from the peak amplifying circuit 7 are combined at the combination node 9. The combined output signal is impedance-converted in the transmission line 10 to be matched to an output load (not shown). Then, the output signal is outputted to the output terminal 2 and connected to the output load.

The FET 62 of the carrier amplifying circuit 6 is biased in class AB. The FET 72 of the peak amplifying circuit 7 is biased in class B or C. Accordingly, when the FET 72 is not operated at a low input level, only the FET 62 is operated. Further, when the FET 62 becomes operated in a saturation region, that is, when the FET 62 begins to lose its linearity, the FET 72 starts its operation, and an output of the FET 72 is supplied to the load. Therefore, the load is operated by the FETs 62 and 72. Accordingly, in the Doherty amplifier, even though an output level is lower than a maximum output level, it is possible to obtain high efficiency.

Further, it is known that a harmonic reflection circuit is used in the Doherty amplifier to further improve efficiency.

Prior Art Document

A conventional amplifier for improving efficiency is disclosed in Japanese Laid-open Publication No. 2005-204208.

In the Laid-open Publication supra, an odd harmonic signal of a fundamental wave signal to be amplified is generated. The generated odd harmonic signal is combined with the fundamental wave signal to be amplified, thereby generating a square wave signal. The square wave signal is amplified by an active device. When the load side is viewed from an output terminal of the active device, an impedance for the odd harmonic signal is infinite, and an impedance for an even harmonic signal is zero. Accordingly, the disclosed amplifier can realize high efficiency.

However, in the conventional class F amplifier, it is not always possible to obtain theoretical voltage and current waveforms shown in FIG. 8. Further, if the amplifying device is saturated, there are many harmonics, but an output level at the fundamental frequency is low and output levels of the harmonics also decrease. Thus, harmonic reflection has a small effect on the improvement of efficiency.

Further, also in an amplifier in which a harmonic reflection circuit is combined with the conventional Doherty amplifier, an output level at the fundamental frequency is low and output levels of the harmonics also decrease, thereby reducing an effect of harmonic reflection on the improvement of efficiency.

Further, in the Laid-open Publication supra, although an odd harmonic is injected into an input of the amplifier, an even harmonic is not injected therein.

SUMMARY OF THE INVENTION

In view of the above, the present invention provides a high frequency power amplifier capable of achieving higher efficiency over a wide output range than a conventional class F amplifier using a harmonic reflection circuit.

Further, the present invention provides a high frequency power amplifier capable of achieving higher efficiency than a conventional Doherty amplifier combined with a harmonic reflection circuit.

In accordance with an embodiment of the present invention, there is provided a high frequency power amplifier comprising: an amplifying device for amplifying an input high frequency signal; a harmonic reflection circuit for reflecting a harmonic outputted from the amplifying device; and a harmonic generating circuit provided at an input terminal of the amplifying device, the harmonic generating circuit including a divider for dividing an input signal of a fundamental wave into two parts, a harmonic generator for generating a second harmonic from one part of the fundamental wave signal, and a combiner for combining the second harmonic generated from the harmonic generator with the other part of the fundamental wave signal to offer a combined signal to the amplifying device, wherein the harmonic reflection circuit reflects the second harmonic.

In accordance with another embodiment of the present invention, there is provided a high frequency power amplifier, which includes a carrier amplifying circuit having a first amplifying device operated in class AB and a peak amplifying circuit having a second amplifying device operated in class B or C to combine outputs of the carrier amplifying circuit and the peak amplifying circuit, the high frequency power amplifier comprising: a harmonic generating circuit including a divider for dividing an input signal of a fundamental wave into two parts, a harmonic generator for generating a second harmonic from one part of the fundamental wave signal, and a combiner for combining the second harmonic generated from the harmonic generator with the other part of the fundamental wave signal; and a dividing device for dividing an output signal of the harmonic generating circuit to produce divided signals, wherein the divided signals are respectively inputted to the carrier amplifying circuit and the peak amplifying circuit, the carrier amplifying circuit includes a harmonic reflection circuit for reflecting a second harmonic outputted from the first amplifying device, and the peak amplifying circuit includes a harmonic reflection circuit for reflecting a second harmonic outputted from the second amplifying device.

In accordance with still another embodiment of the present invention, there is provided a high frequency power amplifier, which includes a carrier amplifying circuit having a first amplifying device operated in class AB and a peak amplifying circuit having a second amplifying device operated in class B or C to combine outputs of the carrier amplifying circuit and the peak amplifying circuit, the high frequency power amplifier comprising: a harmonic generating circuit provided at an input terminal of the carrier amplifying circuit, the harmonic generating circuit including a divider for dividing an input signal of a fundamental wave into two parts, a harmonic generator for generating a second harmonic from one part of the fundamental wave signal, and a combiner for combining the second harmonic generated from the harmonic generator with the other part of the fundamental wave signal to offer a combined signal to the carrier amplifying circuit, wherein the carrier amplifying circuit includes a harmonic reflection circuit for reflecting a second harmonic outputted from the first amplifying device.

BRIEF DESCRIPTION OF THE DRAWINGS

The objects and features of the present invention will become apparent from the following description of embodiments given in conjunction with the accompanying drawings, in which.

DETAILED DESCRIPTION OF THE EMBODIMENTS

Summary of the Invention

Hereinafter, embodiments of the present invention will be described in detail with reference to the accompanying drawings which form a part hereof.

A high frequency power amplifier in accordance with an embodiment of the present invention includes, at an input terminal of an amplifier having a harmonic reflection circuit, a harmonic generator for generating a harmonic and a vector adjuster for adjusting a phase and an amplitude of the harmonic outputted from the harmonic generator. The vector-adjusted harmonic is combined with an input signal of the amplifier having the harmonic reflection circuit. Accordingly, it is possible to increase a harmonic output level of the amplifier and further increase a harmonic reflection level of the output. Further, it is possible to reduce overlapping of voltage and current waveforms and improve power efficiency.

Further, a high frequency power amplifier in accordance with an embodiment of the present invention includes a harmonic generator for generating a harmonic and a vector adjuster for adjusting a phase and an amplitude of the harmonic in front of a divider for dividing an input signal inputted to a carrier amplifying circuit and a peak amplifying circuit 7 in the Doherty amplifier. The vector-adjusted harmonic is combined with the input signal of the carrier amplifying circuit and the peak amplifying circuit. Accordingly, it is possible to increase a harmonic output level of the Doherty amplifier having a harmonic reflection circuit. Thus, it is possible to increase a harmonic reflection level of the output, thereby improving efficiency.

First Embodiment

FIG. 1

Figure 1:
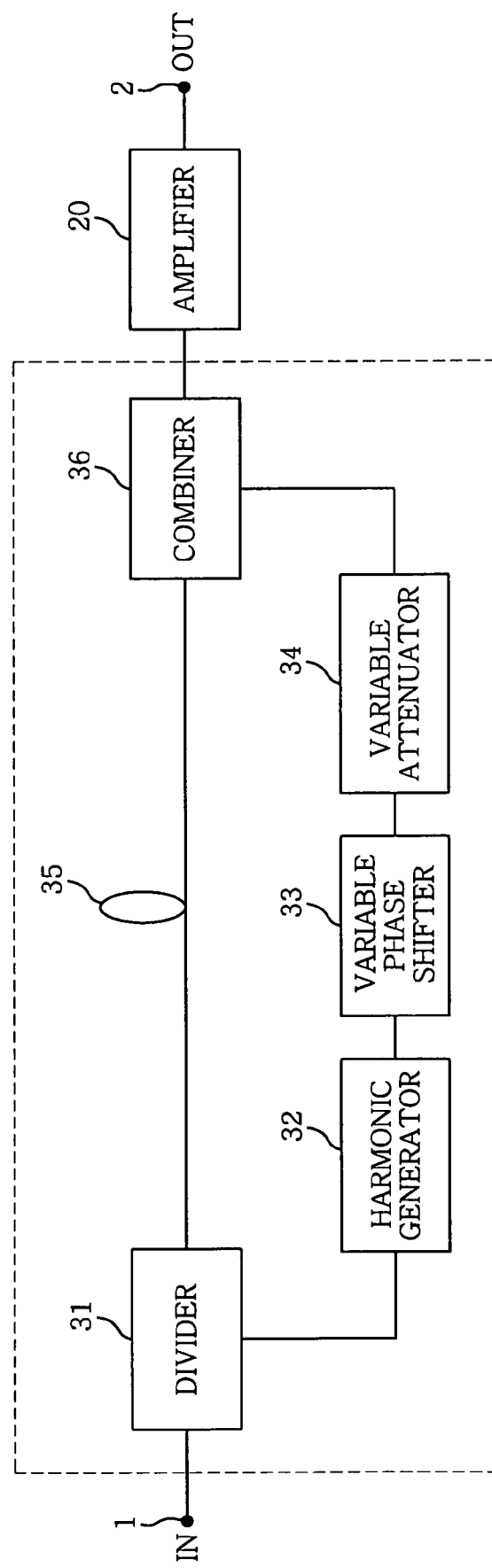
FIG. 1 is a block diagram showing a configuration of a high frequency power amplifier (first amplifier) in accordance with a first embodiment of the present invention.

A high frequency power amplifier in accordance with a first embodiment of the present invention will be described with reference to FIG. 1. FIG. 1 is a block diagram showing a configuration of the high frequency power amplifier (first amplifier) in accordance with the first embodiment of the present invention.

As shown in FIG. 1, the first amplifier includes an input terminal 1, an output terminal 2, an amplifier 20, and a harmonic generating circuit 3 which is a feature of the first amplifier. An input signal inputted from the input terminal 1 is inputted into the amplifier 20 through the harmonic generating circuit 3 and, then, amplified. Then, the amplified signal is outputted to the output terminal 2.

Figure 7A:
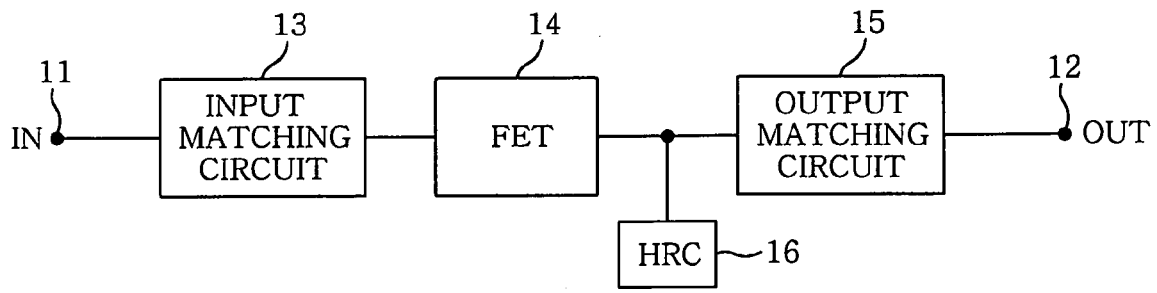
FIGS. 7A and 7B are block diagrams showing schematic configurations of a conventional class F amplifier.

In this case, the amplifier 20 is the conventional high frequency power amplifier shown in FIG. 7A. The amplifier 20 includes an input terminal 11, an input matching circuit 13, an FET (amplifying device) 14, an output matching circuit 15, a harmonic reflection circuit 16 and an output terminal 12. The input matching circuit 13 performs matching at a fundamental frequency.

The harmonic reflection circuit 16 of the amplifier 20 is a high frequency termination circuit having a high input impedance at a fundamental frequency and a low input impedance at a second harmonic frequency.

Preferably, the harmonic reflection circuit is inserted at a position adjacent to the amplifying device with regard to loss in the line, but there is less limitation than the conventional class F amplifier. Further, when a high output amplifying device is used, second harmonic reflection characteristics of an internal matching circuit may be used.

Harmonic Generating Circuit

The harmonic generating circuit 3, which is a feature of the first amplifier, will be described in detail.

The harmonic generating circuit 3 is a circuit for amplifying a harmonic generated in the amplifier 20. The harmonic generating circuit 3 includes a divider 31, a harmonic generator 32, a variable phase shifter 33, a variable attenuator 34, a delay line 35 and a combiner 36.

The divider 31 divides an input signal inputted from the input terminal 1.

The harmonic generator 32 generates a harmonic. In the first amplifier, the harmonic generator 32 generates a second harmonic.

The variable phase shifter 33 adjusts a phase of the second harmonic generated in the harmonic generator 32.

The variable attenuator 34 adjusts an amplitude of the second harmonic generated in the harmonic generator 32.

Further, the variable phase shifter 33 and the variable attenuator 34 correspond to a vector adjuster for performing vector adjustment of the generated second harmonic. The variable phase shifter 33 and the variable attenuator 34 may be arranged in reverse order.

The variable phase shifter 33 and the variable attenuator 34 adjust the phase and amplitude of the second harmonic generated in the harmonic generator 32 such that they have an optimal relationship with the phase and amplitude of the second harmonic generated in the amplifier 20. Also, the variable phase shifter 33 and the variable attenuator 34 optimally adjust a phase deviation and an amplitude level ratio between the fundamental wave and the second harmonic.

The delay line 35 delays an input signal (fundamental wave) from the divider 31 by the processing time in the harmonic generator 32, the variable phase shifter 33 and the variable attenuator 34.

Further, the combiner 36 combines the delayed fundamental wave signal with the second harmonic outputted from the variable attenuator 34 to have the adjusted phase and amplitude. Then, the combiner 36 provides the combined wave to the amplifier 20.

As described above, the harmonic generating circuit 3 is an analog circuit having a simple configuration and includes a vector adjusting circuit for adjusting a phase deviation and an amplitude level ratio between the fundamental wave and the second harmonic. Accordingly, it is possible to accurately adjust an output level and a phase of the harmonic required for the amplifier 20 and to perform a high-efficiency amplifying operation in the amplifier 20.

Further, although the variable phase shifter 33 for adjusting a phase and the variable attenuator 34 for adjusting an amplitude are used in this embodiment, an adjuster for adjusting the phase and amplitude of the harmonic generated in the harmonic generator 32 may be implemented by using any other method for adjusting the phase and amplitude.

Particularly, in the first amplifier, a second harmonic having a high level among the generated harmonics is given attention. The second harmonic is injected into the input of the amplifier and is reflected without loss by the harmonic reflection circuit at the output thereof. Accordingly, the first amplifier has improved efficiency.

Other Configuration of the Amplifier 20

Figure 7B:
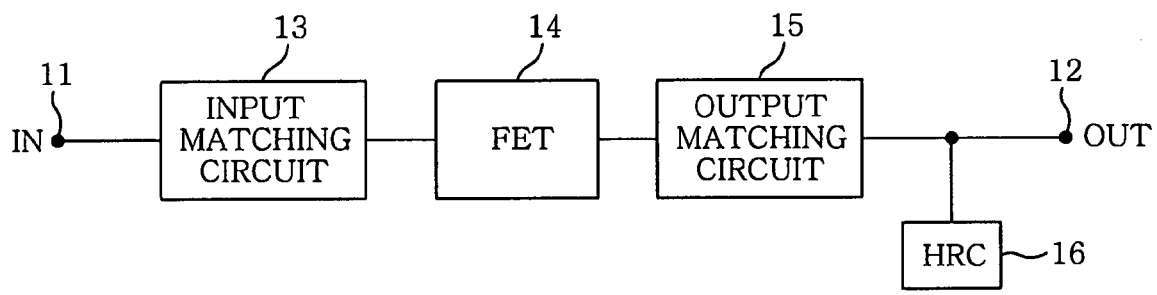
Figure 8:
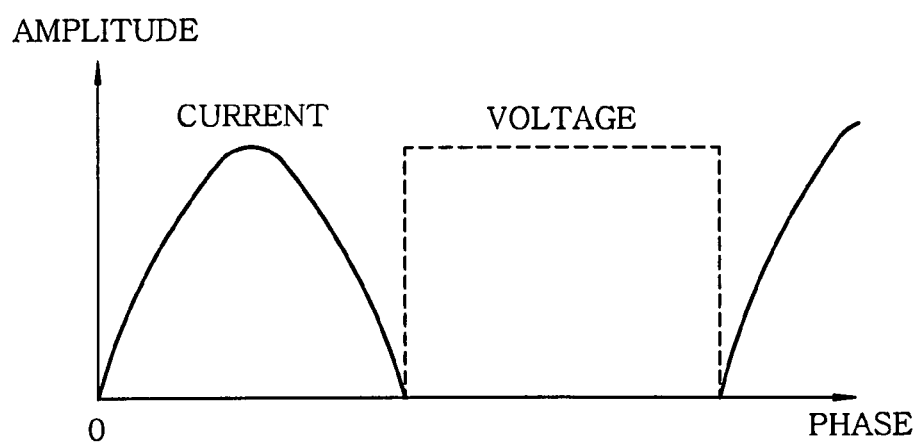
FIG. 8 shows theoretical waveforms of voltage and current in the class F amplifier.

The amplifier 20 may employ the amplifier shown in FIG. 7B.

In this case, the input matching circuit 13 provided at the input terminal of the FET 14 has impedance characteristics in which conjugate matching is performed on an input impedance of the FET 14 at both fundamental wave and its second harmonic frequencies. Further, the output matching circuit 15 provided at the output terminal of the FET 14 has impedance characteristics in which conjugate matching is performed on an output impedance of the FET 14 at both fundamental wave and its second harmonic frequencies.

As described above, when the amplifier shown in FIG. 7B is used as the amplifier 20, the input matching circuit performs matching at both a fundamental frequency and a second harmonic frequency. Accordingly, although a small second harmonic is injected from the harmonic generating circuit 3, it is sufficient and the amplifier may have further improved efficiency.

Operation of the First Amplifier

The operation of the first amplifier is explained with reference to FIGS. 1 and 7A.

A fundamental wave signal inputted from the input terminal 1 is inputted into the harmonic generating circuit 3. The signal is divided into two parts by the divider 31 of the harmonic generating circuit 3. Then, one part of the fundamental wave signal is inputted to the harmonic generator 32 to generate a second harmonic having twice the fundamental frequency.

The phase and amplitude of the generated second harmonic are adjusted by the variable phase shifter 33 and the variable attenuator 34, respectively. Then, the second harmonic is inputted to the combiner 36.

The other part of the fundamental wave signal, divided by the divider 31, is delayed by the delay line 35 to have a delayed phase. Then, the other part is inputted to the combiner 36 and combined with the vector-adjusted second harmonic.

The combiner 36 provides a combined signal of the fundamental wave and the vector-adjusted second harmonic to the amplifier 20.

In the amplifier 20, the combined signal is inputted into the FET 14 of the active device through the input matching circuit 13 and, then, amplified. Then, the amplified signal is outputted to the output terminal 12.

Since the combined signal includes a second harmonic, the second harmonic generated at the drain terminal of the FET 14 has a higher level than a conventional case. Accordingly, although the FET has a low harmonic gain or a low output power with fewer harmonics, the amplifier can be efficiently operated.

Further, since the harmonic reflection circuit reflects a second harmonic without reflecting a fundamental wave, it is possible to increase a harmonic reflection level of the output. Further, it is possible to reduce overlapping of voltage and current waveforms, thereby improving efficiency.

Configuration of the Harmonic Generator 32

FIG. 2

Figure 2:
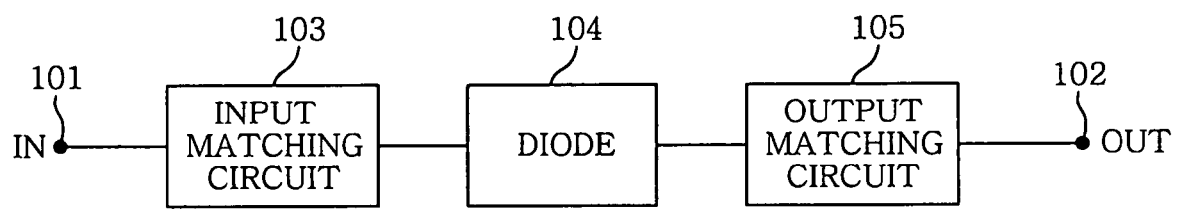
FIG. 2 is a block diagram showing a configuration of a harmonic generator.

Next, a configuration of the harmonic generator 32 is explained with reference to FIG. 2. FIG. 2 is a block diagram showing the configuration of the harmonic generator 32.

As shown in FIG. 2, the harmonic generator 32 includes an input terminal 101, an input matching circuit 103, a diode 104, an output matching circuit 105 and an output terminal 102, which are connected in series.

The diode 104 amplifies an input signal and generates a second harmonic. The diode 104 may be replaced by an FET or the like capable of generating harmonics.

The input matching circuit 103 is an impedance conversion circuit for performing matching at a fundamental frequency to transmit an input signal without loss.

Further, the output matching circuit 105 is an impedance conversion circuit for performing matching at a harmonic frequency to output the second harmonic generated from the diode 104 without unnecessary loss.

The input matching circuit 103 and the output matching circuit 105 include a transmission line such as a microstrip line, a circuit device such as a condenser or coil, or a circuit having a combination thereof.

The input signal inputted from the input terminal 101 of the harmonic generator 32 is impedance-converted by the input matching circuit 103 and amplified by the diode 104 to generate a second harmonic.

The signal having a second harmonic is impedance-converted by the output matching circuit 105. Then, the signal having a high-level second harmonic is outputted to the output terminal 102.

Further, the phase and amplitude of the signal are adjusted by the variable phase shifter 33 and the variable attenuator 34 of the harmonic generating circuit 3. Then, the signal is combined with a fundamental wave by the combiner 36 and the combined signal is outputted to the amplifier 20.

Characteristics of the First Amplifier

FIG. 3

Figure 3:
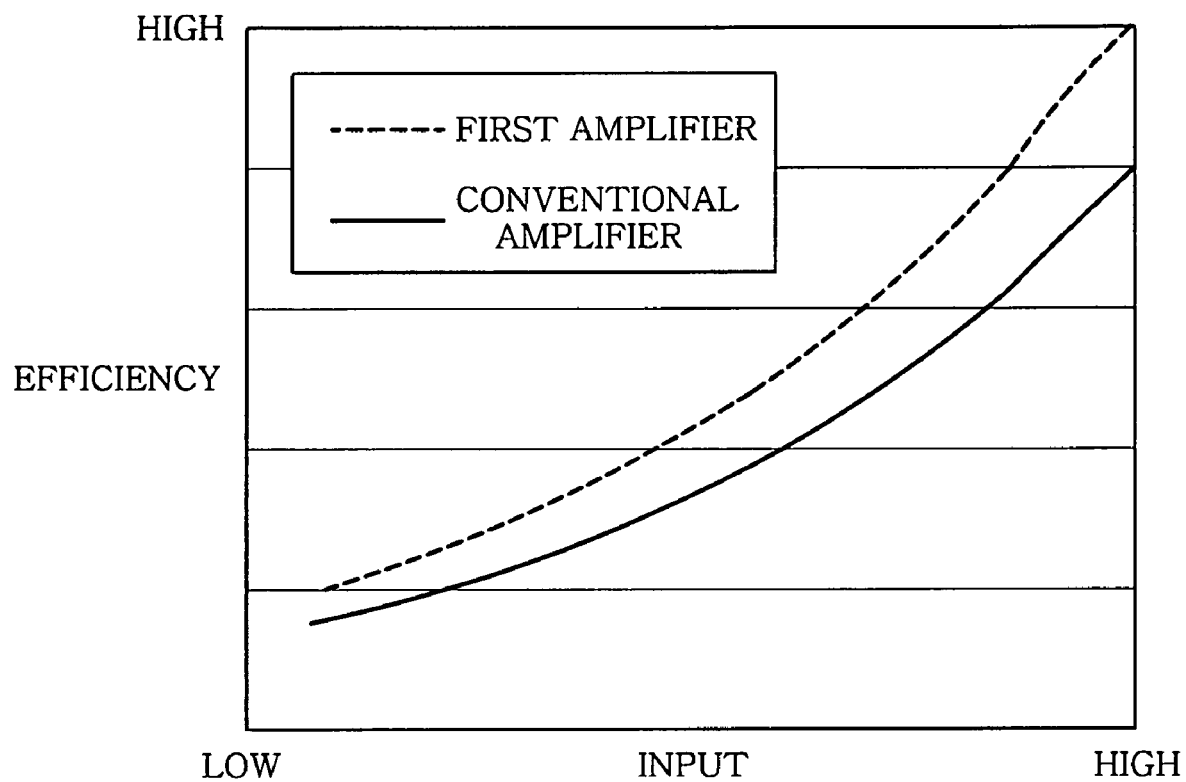
FIG. 3 shows a relationship between input power and power efficiency in the first amplifier.

Next, the characteristics of the first amplifier are explained with reference to FIG. 3. FIG. 3 shows a relationship between input power and power efficiency in the first amplifier.

In FIG. 3, a solid line represents the characteristics of a conventional amplifier having a harmonic reflection circuit and a dotted line represents the characteristics of the first amplifier in which a second harmonic is injected into an input signal.

As shown in FIG. 3, the first amplifier exhibits higher efficiency than the conventional amplifier having a harmonic reflection circuit over a wide range from a low input power to a high input power. As for the reason, in the first amplifier, a second harmonic is injected into an input signal to increase a second harmonic output level. Since the harmonic reflection circuit is also used in the first amplifier, it is possible to optimize an input phase or current waveform and reduce overlapping of voltage and current waveforms, thereby further improving efficiency.

Effects of the First Embodiment

In the high frequency power amplifier (first amplifier) having a harmonic reflection circuit in accordance with the first embodiment of the present invention, the harmonic generator 32 for generating a second harmonic, the variable phase shifter 33 for adjusting a phase of the generated second harmonic and the variable attenuator 34 for adjusting an amplitude of the second harmonic are provided at an input terminal of the amplifier 20. A second harmonic is injected into an input signal of a fundamental wave and they are combined to generate a combined signal. The combined signal is inputted to the amplifier 20 to be amplified. Further, the second harmonic is reflected by the harmonic reflection circuit 16 of the amplifier 20 and, then, inputted into the FET 14. Accordingly, there are effects of increasing a second harmonic reflection level, reducing overlapping of voltage and current waveforms, and improving efficiency.

Further, in the first amplifier, the injected harmonic is a second harmonic having a high level. Thus, there is an effect of further improving efficiency.

Further, in the conventional amplifier, the harmonic reflection circuit needs to be controlled in order to adjust the phase and amplitude of the harmonic. Accordingly, there is a worrisome possibility that a circuit size increases. However, in the first amplifier, it is possible to adjust the phase and amplitude of the second harmonic inputted to the harmonic generating circuit 3 such that they have an optimal relationship with the phase and amplitude of the second harmonic generated in the FET of the amplifier 20 by adjusting the variable phase shifter 33 and the variable attenuator 34. Thus, there is an effect of further improving efficiency with a simple configuration.

Further, the amplifier 20 may employ the amplifier, shown in FIG. 7B, for performing matching at a second harmonic frequency. Accordingly, it is possible to reduce a second harmonic level injected into an input signal. Thus, there is an effect of further improving power conversion efficiency.

Further, although a configuration for injecting a second harmonic is explained in this embodiment, it is possible to further reduce overlapping of current and voltage waveforms by injecting a fourth (or higher) even harmonic. In this case, a harmonic generating circuit for generating a fourth (or higher) harmonic may be arranged in parallel to the harmonic generating circuit 3 shown in FIG. 1. Since the respective harmonic generating circuits for generating second and fourth (or higher) harmonics have the same configuration, it is preferable to change a frequency of a generated harmonic.

Second Embodiment

FIG. 4

Figure 4:
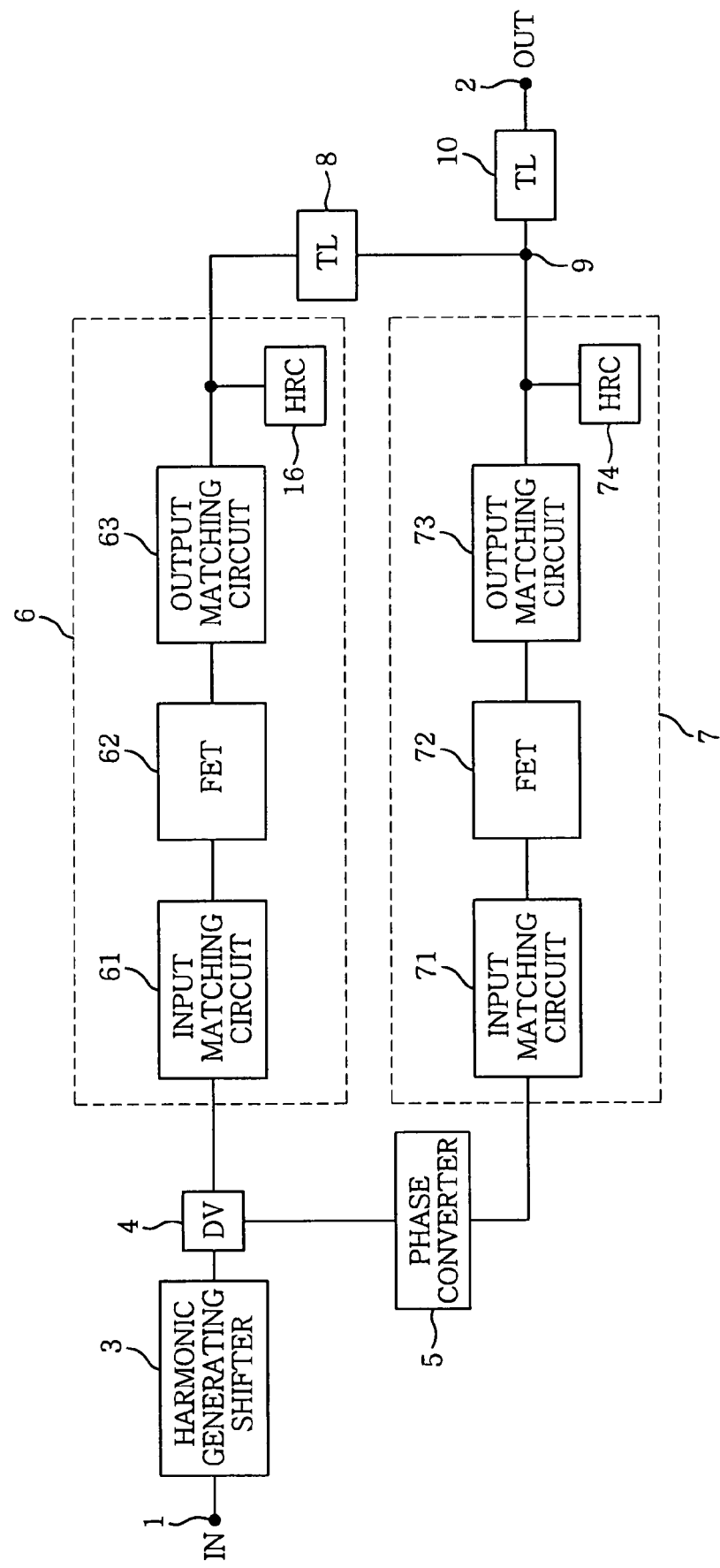
FIG. 4 is a block diagram showing a configuration of a high frequency power amplifier (second amplifier) in accordance with a second embodiment of the present invention.

A high frequency power amplifier in accordance with a second embodiment of the present invention will be described with reference to FIG. 4. FIG. 4 is a block diagram showing a configuration of the high frequency power amplifier (second amplifier) in accordance with the second embodiment of the present invention.

As shown in FIG. 4, in the second amplifier, a harmonic reflection circuit for reflecting a second harmonic is included in each of the carrier amplifying circuit 6 and the peak amplifying circuit 7 of the Doherty amplifier. Further, the harmonic generating circuit 3 for injecting a second harmonic into an input signal is provided in front of the Doherty amplifier.

Specifically, the second amplifier includes an input terminal 1, a harmonic generating circuit 3, a divider 4, a phase shifter 5, a carrier amplifying circuit 6, a peak amplifying circuit 7, transmission lines 8 and 10, and a combination node 9. Since the divider 4, the phase shifter 5, the transmission line 8, the combination node 9 and the transmission line 10 have the same configurations as those of the conventional Doherty amplifier shown in FIG. 9, a description thereof is omitted.

Since the harmonic generating circuit 3, which is a feature of the second amplifier, has the same configuration as the harmonic generating circuit 3 shown in FIG. 1, an explanation is made with reference to FIG. 1.

As shown in FIG. 1, the harmonic generating circuit 3 of the second amplifier includes a divider 31, a delay line 35, a harmonic generator 32, a variable phase shifter 33, a variable attenuator 34 and a combiner 36. Further, a second harmonic is generated from a fundamental wave of an input signal. The phase and amplitude of the generated second harmonic are adjusted. Then, the second harmonic is combined with the fundamental wave. Thus, a combined signal having a high-level second harmonic is outputted to the divider 4.

Further, the harmonic generator 32 of the harmonic generating circuit 3 has the same configuration as the harmonic generator shown in FIG. 2. The harmonic generator 32 includes an input terminal 101, an input matching circuit 103, a diode 104, an output matching circuit 105 and an output terminal 102.

The harmonic generating circuit 3 of the second amplifier amplifies a second harmonic generated in the Doherty amplifier. The variable phase shifter 33 and the variable attenuator 34 perform a vector adjustment such that the phase and amplitude of the second harmonic injected to the harmonic generating circuit 3 have an optimal relationship with the phase and amplitude of the second harmonic generated in the Doherty amplifier.

Figure 9:
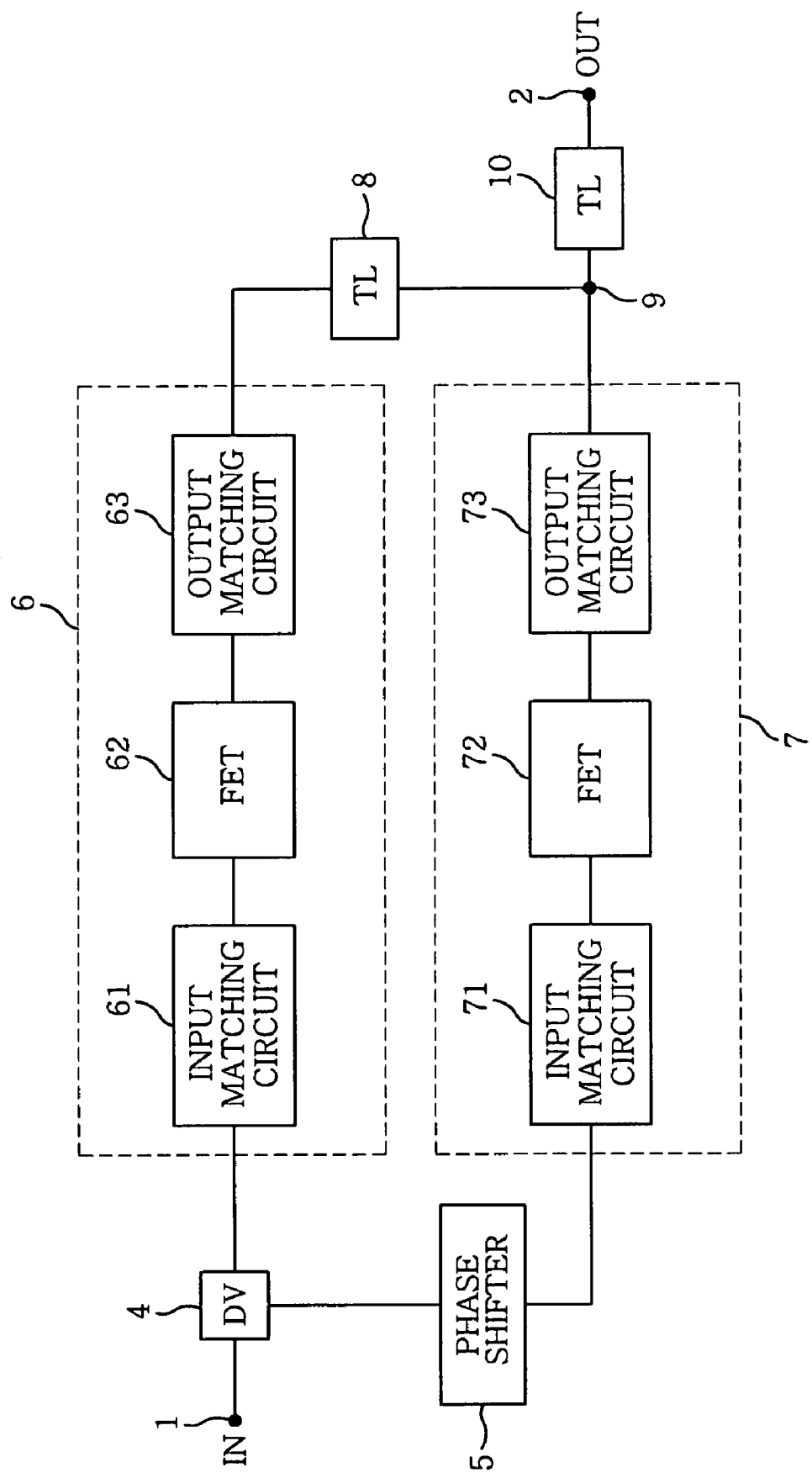
FIG. 9 is a block diagram showing a configuration of a conventional Doherty amplifier.

The carrier amplifying circuit 6 includes an input matching circuit 61, an FET (carrier amplifying device) 62 and an output matching circuit 63, which are the same parts as those of the conventional Doherty amplifier shown in FIG. 9, and a harmonic reflection circuit 64, which is a feature of the second amplifier.

Further, the peak amplifying circuit 7 includes an input matching circuit 71, an FET (peak amplifying device) 72 and an output matching circuit 73, which are the same parts as those of the conventional Doherty amplifier, and a harmonic reflection circuit (HRC) 74, which is a feature of the second amplifier. The description of the same parts as those of the conventional Doherty amplifier is omitted.

Each of the harmonic reflection circuit 64 of the carrier amplifying circuit 6 and the harmonic reflection circuit 74 of the peak amplifying circuit 7 has impedance characteristics to reflect a second harmonic without influencing a fundamental wave. Preferably, the harmonic reflection circuit 64 and the harmonic reflection circuit 74 are inserted at positions adjacent to the amplifying device with regard to loss in the line, but there is less limitation than the conventional class F amplifier. Further, when a high output amplifying device is used, second harmonic reflection characteristics of an internal matching circuit may be used.

Operation of the Second Amplifier

The operation of the second amplifier is explained with reference to FIGS. 4 and 1.

In the second amplifier, a fundamental wave signal inputted from the input terminal 1 of FIG. 4 is inputted to the harmonic generating circuit 3. The fundamental wave signal is divided into two parts by the divider 31 of the harmonic generating circuit 3. Then, one part of the fundamental wave signal is inputted to the harmonic generator 32 to generate a second harmonic having twice the fundamental frequency.

The phase and amplitude of the generated second harmonic are adjusted by the variable phase shifter 33 and the variable attenuator 34, respectively. Then, the second harmonic is inputted to the combiner 36.

The other part of the fundamental wave signal, divided by the divider 31 of the harmonic generating circuit 3, is delayed by the delay line 35. Then, the other part is inputted to the combiner 36 and combined with the vector-adjusted second harmonic. The combined signal is outputted to the divider 4 of the Doherty amplifier of FIG. 9.

Further, the signal inputted to the carrier amplifying circuit 6 is amplified and outputted to the combination node 9 through the transmission line 8. The signal, inputted to the peak amplifying circuit 7 through the phase shifter 5, is amplified and outputted to the combination node 9. After the signals are combined at the combination node 9, the combined signal is outputted to an output terminal through the transmission line 10.

That is, in the second amplifier, the signals, inputted to the carrier amplifying circuit 6 and the peak amplifying circuit 7 of the Doherty amplifier, have high-level second harmonics. Accordingly, it is possible to increase an output level of the second harmonic and further increase a second harmonic reflection level reflected to the FETs 62 and 72 by the harmonic reflection circuits 64 and 74 of the carrier amplifying circuit 6 and peak amplifying circuit 7. Further, it is possible to reduce overlapping of voltage and current waveforms and improve power efficiency.

Further, the characteristics of the second amplifier will be described later with reference to FIG. 6.

Effects of the Second Embodiment

In the high frequency power amplifier (second amplifier) in accordance with the second embodiment of the present invention, the harmonic generator 32 for generating a second harmonic, the variable phase shifter 33 for adjusting a phase of the generated second harmonic and the variable attenuator 34 for adjusting an amplitude of the second harmonic are provided at an input terminal of the Doherty amplifier. A second harmonic is injected into an input signal and they are combined to generate a combined signal. The combined signal is inputted to the Doherty amplifier to increase a harmonic output level of the FET. Further, the carrier amplifying circuit 6 and the peak amplifying circuit 7 of the Doherty amplifier include the harmonic reflection circuits 64 and 74, respectively, to reflect high-level second harmonics, thereby increasing a second harmonic reflection level. Thus, there are effects of reducing overlapping of voltage and current waveforms and improving efficiency.

Further, it is possible to adjust the phase and amplitude of a second harmonic inputted into a fundamental wave in the harmonic generating circuit 3 such that they have an optimal relationship with the phase and amplitude of a second harmonic generated in the Doherty amplifier by adjusting the variable phase shifter 33 and the variable attenuator 34 of the harmonic generating circuit 3. Thus, there is an effect of further improving efficiency with a simple configuration.

Further, in the conventional amplifier, the harmonic reflection circuit needs to be controlled in order to adjust the phase and amplitude of the second harmonic. Also, it is necessary to adjust the output matching circuit. It is difficult to perform matching of a fundamental wave and matching of a second harmonic at the same time. However, in the second amplifier, since a second harmonic is injected into an input signal and the phase and amplitude of the second harmonic are adjusted by the variable phase shifter 33 and the variable attenuator 34, there is an effect of easily perform matching of a fundamental wave and matching of a second harmonic at the same time.

Further, when a harmonic generating circuit for generating a fourth or higher even harmonic is provided in parallel to the harmonic generating circuit 3 shown in FIG. 4 and a fourth or higher even harmonic is injected to the input of the Doherty amplifier, there is an effect of further improving efficiency.

Third Embodiment

FIG. 5

Figure 5:
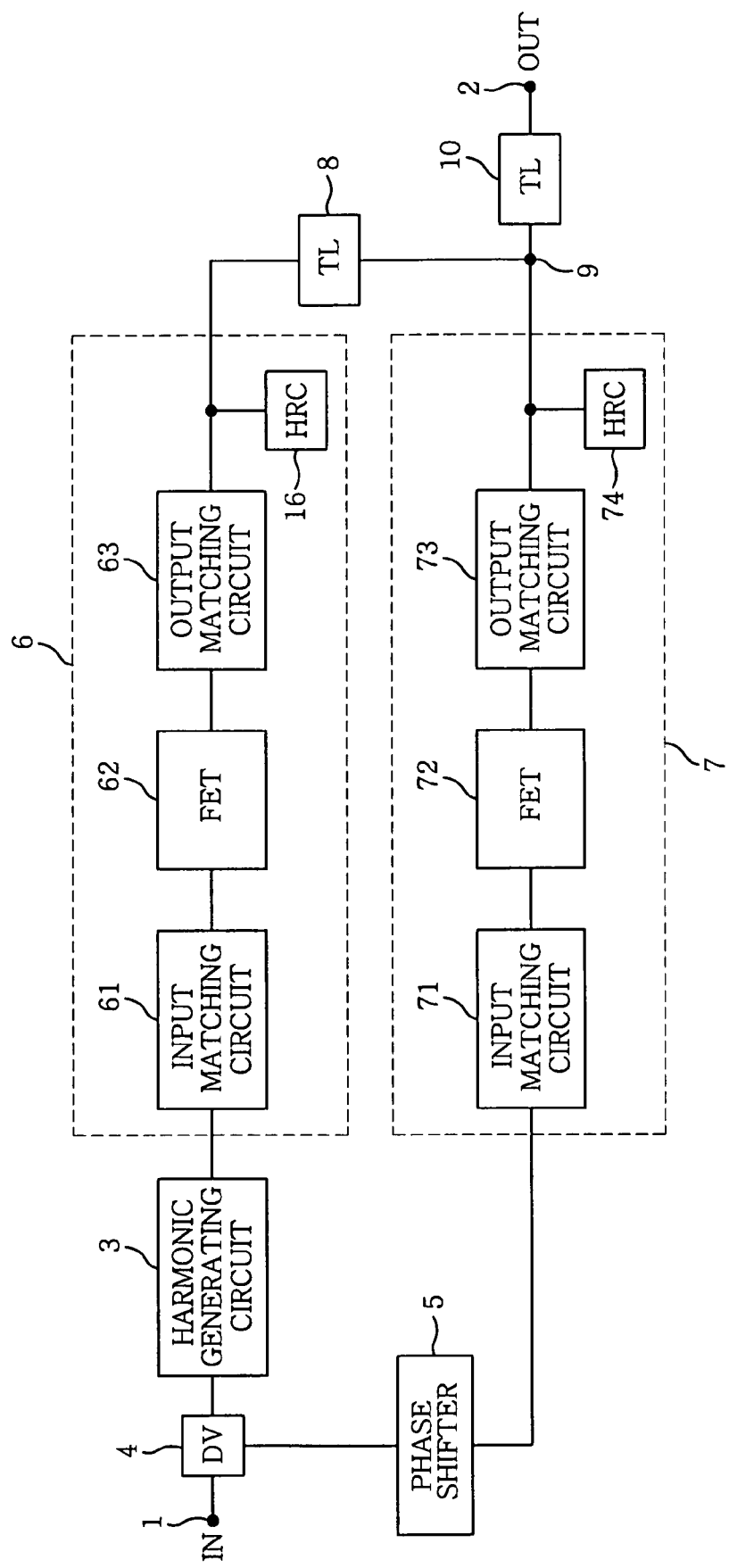
FIG. 5 is a block diagram showing a configuration of a high frequency power amplifier (third amplifier) in accordance with a third embodiment of the present invention.

Next, a high frequency power amplifier in accordance with a third embodiment of the present invention will be described with reference to FIG. 5. FIG. 5 is a block diagram showing a configuration of the high frequency power amplifier (third amplifier) in accordance with the third embodiment of the present invention.

In the same way as the second amplifier, the third amplifier includes a harmonic generating circuit for injecting a second harmonic into the Doherty amplifier. However, the third amplifier is different from the second amplifier in that a second harmonic is injected into only an input of the carrier amplifying circuit.

As shown in FIG. 5, in the third amplifier, the harmonic generating circuit 3 is provided at an input terminal of the carrier amplifying circuit 6, and the carrier amplifying circuit 6 includes the harmonic reflection circuit 64.

The harmonic generating circuit 3 of the third amplifier has the same configuration as the harmonic generating circuit 3 of the second amplifier. A second harmonic is injected to an input signal of the carrier amplifying circuit 6. In the harmonic generating circuit 3 of the third amplifier, the phase and amplitude of the injected second harmonic are adjusted by the variable phase shifter 33 and the variable attenuator 34 such that they have an optimal relationship with the phase and amplitude of the second harmonic generated in the carrier amplifying circuit 6.

In the Doherty amplifier, a high efficiency operation is performed in the peak amplifying circuit 7 and the peak amplifying circuit 7 is operated for a short period of time. Accordingly, efficiency of the peak amplifying circuit 7 has little influence on total efficiency.

The third amplifier uses the above fact and has a configuration in which a second harmonic is injected into only the carrier amplifying circuit 6. A harmonic reflection circuit of the peak amplifying circuit 7 is unnecessary. Further, it is possible to reduce power required for injection of a second harmonic compared to the second amplifier.

Further, when a harmonic is injected into only the carrier amplifying circuit 6, the peak amplifying circuit 7 may include a harmonic reflection circuit.

Characteristics of the Second and Third Amplifiers

FIG. 6

Next, the characteristics of the second and third amplifiers are explained with reference to FIG. 6. FIG. 6 shows a relationship between input power and power efficiency in the second and third amplifiers.

Figure 6:
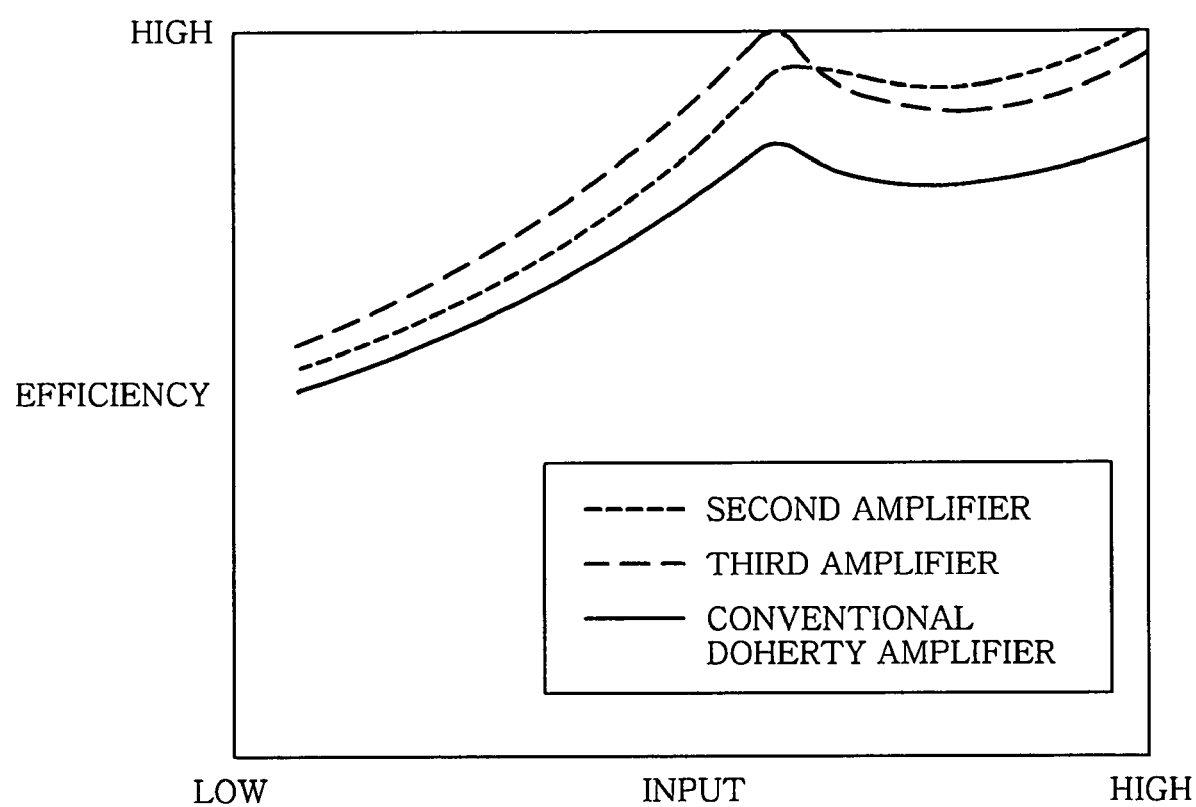
FIG. 6 shows a relationship between input power and power efficiency in the second and third amplifiers.

In FIG. 6, a solid line represents the characteristics of the conventional Doherty amplifier and a dotted line represents the characteristics of the second amplifier in which a second harmonic is injected into each input signal of the carrier amplifying circuit and the peak amplifying circuit. Further, a dashed line represents the characteristics of the third amplifier in which a second harmonic is injected into only an input signal of the carrier amplifying circuit.

As shown in FIG. 6, both the second and third amplifiers exhibit higher efficiency than the conventional Doherty amplifier over a wide range from a low input power to a high input power. Particularly, it can be seen from FIG. 6 that the third amplifier exhibits higher efficiency than the second amplifier at an input level at which only the carrier amplifying circuit 6 is operated. At a level at which the operation of the peak amplifying circuit 7 is started, the efficiency is somewhat reduced, but it has little influence on total efficiency.

Effects of the Third Embodiment

In the high frequency power amplifier (third amplifier) having a harmonic reflection circuit in accordance with the third embodiment of the present invention, the harmonic generator 32 for generating a second harmonic, the variable phase shifter 33 for adjusting a phase of the generated second harmonic and the variable attenuator 34 for adjusting an amplitude of the second harmonic are provided at an input terminal of the carrier amplifying circuit 6. A second harmonic is injected into an input signal and they are combined to generate a combined signal. The combined signal is inputted to the carrier amplifying circuit 6 to increase a harmonic output level of the FET. Further, the carrier amplifying circuit 6 includes the harmonic reflection circuit 64 to reflect a high-level second harmonic amplified by the FET 62, thereby increasing a second harmonic reflection level. Thus, there are effects of reducing overlapping of voltage and current waveforms and improving efficiency.

Further, in the third amplifier, a second harmonic is injected into only the carrier amplifying circuit 6. Accordingly, the third amplifier may have a simpler configuration than that of the second amplifier. Further, it is possible to reduce power required for generation of a second harmonic to be injected. Particularly, it is possible to further improve efficiency over a wide input level range in which only the carrier amplifying circuit 6 is operated.

Further, as another configuration, when harmonics are injected to both the carrier amplifying circuit 6 and the peak amplifying circuit 7, in addition to the configuration of the second amplifier shown in FIG. 4, although not shown in the drawings, an additional harmonic generating circuit may be inserted between the phase shifter 5 and the peak amplifying circuit 7 in the third amplifier shown in FIG. 5. In this case, a harmonic is injected to each of the carrier amplifying circuit 6 and the peak amplifying circuit 7 while changing an injection level to further improve efficiency.

The present invention may be applied to a high frequency power amplifier capable of improving power conversion efficiency.

While the invention has been shown and described with respect to the embodiments, it will be understood by those skilled in the art that various changes and modifications may be made without departing from the scope of the invention as defined in the following claims.

What is claimed is:

1. A high frequency power amplifier comprising:
an amplifying device for amplifying an input high frequency signal;
a harmonic reflection circuit for reflecting a harmonic outputted from the amplifying device; and
a harmonic generating circuit provided at an input terminal of the amplifying device, the harmonic generating circuit including a divider for dividing an input signal of a fundamental wave into two parts, a harmonic generator for generating a second harmonic from one part of the fundamental wave signal, and a combiner for combining the second harmonic generated from the harmonic generator with the other part of the fundamental wave signal to offer a combined signal to the amplifying device,
wherein the harmonic reflection circuit reflects the second harmonic.

2. The high frequency power amplifier of claim 1, wherein the harmonic generating circuit further includes an adjuster for adjusting a phase and an amplitude of the second harmonic generated from the harmonic generator to combine the second harmonic having the adjusted phase and amplitude with the other part of the fundamental wave signal.

3. The high frequency power amplifier of claim 1, wherein the harmonic generator includes an input matching circuit and an output matching circuit for a harmonic generating device to appropriately generate a harmonic.

4. A high frequency power amplifier, which includes a carrier amplifying circuit having a first amplifying device operated in class AB and a peak amplifying circuit having a second amplifying device operated in class B or C to combine outputs of the carrier amplifying circuit and the peak amplifying circuit, the high frequency power amplifier comprising:
a harmonic generating circuit including a divider for dividing an input signal of a fundamental wave into two parts, a harmonic generator for generating a second harmonic from one part of the fundamental wave signal, and a combiner for combining the second harmonic generated from the harmonic generator with the other part of the fundamental wave signal; and a dividing device for dividing an output signal of the harmonic generating circuit to produce divided signals,
wherein the divided signals are respectively inputted to the carrier amplifying circuit and the peak amplifying circuit,
the carrier amplifying circuit includes a harmonic reflection circuit for reflecting a second harmonic outputted from the first amplifying device, and
the peak amplifying circuit includes a harmonic reflection circuit for reflecting a second harmonic outputted from the second amplifying device.

5. The high frequency power amplifier of claim 4, wherein the harmonic generating circuit further includes an adjuster for adjusting a phase and an amplitude of the second harmonic generated from the harmonic generator to combine the second harmonic having the adjusted phase and amplitude with the other part of the fundamental wave signal.

6. The high frequency power amplifier of claim 4, wherein the harmonic generator includes an input matching circuit and an output matching circuit for a harmonic generating device to appropriately generate a harmonic.

7. A high frequency power amplifier, which includes a carrier amplifying circuit having a first amplifying device operated in class AB and a peak amplifying circuit having a second amplifying device operated in class B or C to combine outputs of the carrier amplifying circuit and the peak amplifying circuit, the high frequency power amplifier comprising:
a harmonic generating circuit provided at an input terminal of the carrier amplifying circuit, the harmonic generating circuit including a divider for dividing an input signal of a fundamental wave into two parts, a harmonic generator for generating a second harmonic from one part of the fundamental wave signal, and a combiner for combining the second harmonic generated from the harmonic generator with the other part of the fundamental wave signal to offer a combined signal to the carrier amplifying circuit,
wherein the carrier amplifying circuit includes a harmonic reflection circuit for reflecting a second harmonic outputted from the first amplifying device.

* * * * *